United States Patent [19]

Boucher et al.

[11] Patent Number: 5,148,969
[45] Date of Patent: Sep. 22, 1992

[54] COMPONENT RECLAMATION APPARATUS AND METHOD

[75] Inventors: Bernard J. Boucher, Fitchburg, Mass.; Kerry S. Dinsmore, Nashua, N.H.; John A. Malesky, Auburn, Mass.; Douglas A. Brochu, Manchester, N.H.

[73] Assignee: Digital Equipment Corporation, Maynard, Mass.

[21] Appl. No.: 799,535

[22] Filed: Nov. 27, 1991

[51] Int. Cl.[5] .......................... B23K 1/00; B23K 3/00
[52] U.S. Cl. ..................................... 228/264; 228/19; 228/47; 156/584
[58] Field of Search ............... 228/119, 176, 191, 264, 228/18, 19, 47; 29/762; 156/584

[56] References Cited

U.S. PATENT DOCUMENTS

| | | |
|---|---|---|
| 3,557,430 | 1/1971 | Jones . |
| 3,684,151 | 8/1972 | Burman et al. ............... 228/19 |
| 3,879,836 | 4/1975 | Coffin ............... 228/264 |
| 4,022,370 | 5/1977 | Durney ............... 228/191 |
| 4,270,260 | 6/1981 | Krueger ............... 228/119 |
| 4,392,290 | 7/1983 | Krzeptowski ............... 228/264 |
| 4,561,584 | 12/1985 | Hug ............... 228/19 |
| 4,832,249 | 5/1989 | Ehler ............... 228/264 |

FOREIGN PATENT DOCUMENTS 1357066 6/1974 United Kingdom ............... 228/264

OTHER PUBLICATIONS

IBM Technical Disclosure Bulletin, "Accurate Chip Placement on a Substrate", DeBoskey and Rajac, vol. 16, No. 4, p. 1154, Sep. 1973.
"Continuous Process Equipment for Module and Component Removal", IBM Technical Disclosure Bulletin, vol. 28, No. 1, pp. 178-179, Jun., 1985.
"Chip Salvage Head: Removes Good Chips From Bad Modules For Reuse", R. R. Bechard and G. E. Newbury, IBM Technical Disclosure Bulletin, vol. 26, No. 10A, pp. 5189-5190, Mar., 1984.
"Chip Salvage/Rework Procedure", R. J. Herdzik, N. G. Koopman, and E. J. Sullivan, IBM Technical Disclosure Bulletin, vol. 18, No. 3, pp. 719-720, Aug., 1975.
"Solder Transfer Technique", by R. W. Noth and G. C. Sommer, Jr., IBM Technical Disclosure Bulletin, vol. 17, No. 9, dated Feb., 1975.
"Salvaging Elements Soldered to Substrate", E. K. Altman and J. T. Konosky, IBM Technical Disclosure Bulletin, vol. 11, No. 3, p. 217, Aug., 1968.
"Infrared Reflow Soldering Reexamined", by Philip Zarrow, Vitronics Corporations, Newmarket, New Hampshire, pp. 788-796.
"Flexibility and Repeatability in Radiant/Convective Reflow", by W. James Hall, Dynapert, Beverly, Massachusetts, pp. 797-803.

Primary Examiner—Samuel M. Heinrich
Attorney, Agent, or Firm—William P. Skladony; Ronald E. Myrick; Barry N. Young

[57] ABSTRACT

This invention relates to an apparatus and method by which electronic components can be reclaimed from printed circuit boards. In the preferred embodiment, the reclamation system includes a conveyor which grasps the edges of the boards and holds them at an angle so that the component sides of the boards are facing downward. The conveyor carries the boards past infrared panels which heat each board, so that the solder bonding the components to a given board is made to reflow. While the solder is in a reflow state, each board is struck with a tapper, the impact of which has a tendency to dislodge the components. Falling components are caught in bins where they can be collected. In addition, the reclamation system is configured such that a number of operators are able to work in front of the boards passing on the conveyor. Therefore, if the tapper fails to dislodge any components on a given board, an operator can manually remove the components before the board is itself removed from the conveyor. Given that the system accommodates the simultaneous processing of a number of boards, a high volume throughput can be achieved.

33 Claims, 9 Drawing Sheets

COMPONENT RECLAMATION APPARATUS AND METHOD

FIELD OF THE INVENTION

This invention relates to an apparatus and method for reclaiming electrical circuit components from printed circuit boards, and more particularly the invention relates to reclaiming components from the boards by exposing them to thermal radiation and mechanical shock or impact.

BACKGROUND OF THE INVENTION

The printed circuit boards of modern computer systems are typically populated with a variety of electrical components, such as integrated circuit ("IC") devices, diodes, capacitors, and resistors. Such components are usually affixed to a given board by means of a solder bond.

After the board has served its useful life, it is often desirable to remove the components from the board so that those components can be used in another application, or so that the board can be sold as scrap without including any components still on it. IC devices are particularly attractive candidates for reclamation because they are usually the most expensive components on the board. Provided they are not damaged prior to or during the removal process, they can be reused.

In a high volume reclamation process, it is desirable to remove all of the components on the board in as little time as possible, as opposed to the removal of only one or two components. Individual component removal is sometimes done when only one, or a few, components are to be reclaimed from a given board.

A number of approaches to component removal have developed. For example, the apparatus shown in U.S. Pat. No. 3,684,151 issued to Burman et al. on Aug. 15, 1972, generally shows using a substantially closed bath of molten solder to cause the solder bonding the component to the board to reflow. According to Burman, the board is positioned above an opening in the bath by means of a template so that the leads of one of the components on the board are exposed to the molten solder bath. The molten solder thereby causes the solder bonding the leads to reflow and the component can be removed. The operator can then move the board into another position by means of the template to position another component over the opening in the bath, and repeat the process.

The apparatus shown in Burman is configured for the removal of one component at a time, which is not consistent with the objectives of high volume component reclamation. Additionally, it has been found that when solder reflow is accomplished by means of exposing a portion of a board to a molten solder bath, any solder which is on the exposed portion of the board tends to retain a patch of molten solder wherever the exposed solder contacted the bath. Eventually, that patch will harden. This approach may not present significant drawbacks to the reclamation of a single component from a board, given that there will only be a relatively small patch of solder on a portion of the board. It does, however, present significant problems when removing many or all components because a far greater portion of the board picks up the solder which adds to the weight of the board.

Another known approach to component reclamation is shown in U.S. Pat. No. 3,879,836, issued to Coffin on Apr. 29, 1975. In this patent, the board is placed in a vessel so that after the solder affixing the leads is made to reflow, a vacuum can be applied to the component side of the board to remove the components. This approach requires the added complexity of having a vacuum chamber, which is capable of establishing a seal between the chamber and the board, and the vacuum apparatus. Furthermore, Coffin shows the processing of only one board at a time, which has a bearing on the throughput of the system.

Yet another approach to component reclamation is shown in U.S. Pat. No. 4,270,260, issued to Krueger on Jun. 2, 1981. According to Krueger an individual printed circuit board is placed on a mounting frame which secures the board while it is exposed to infrared energy to cause the solder joints to reach their melting temperature. After melting temperature is reached, an extraction tool can be used to remove the components. Drawbacks to the approach shown in Krueger are that each component must be manually removed, and the apparatus is shown to accommodate one board at a time.

What is needed is a component reclamation system which is capable of a high volume throughput by processing multiple boards at the same time, and which is reliable and easy to use.

SUMMARY OF THE INVENTION

The present invention relates to an apparatus and method for removing components from a printed circuit board under the influence of thermal radiation and mechanical impact. The apparatus includes a conveyor system on which boards are placed side by side. The boards can be mounted on the conveyor so that they are at an angle that is oblique with respect to a horizontal plane with the component side of the board facing down.

In the preferred form of the invention, the conveyor moves the boards past infrared (IR) panels, which are positioned relative to the moving boards so that the infrared radiation is directed to the upwardly facing (i.e. the non chip side) of each board. The radiation from the IR panels will cause the solder bonding the leads to the boards to soften and reflow. After the solder has been made to reflow, and as the boards continue to move on the conveyor, they pass under a tapper device which strikes the backsides of each board a number of times. The impact of the tapper, however, is not enough to damage the boards or the components. Depending upon the method by which the leads of the components are bonded to the board, the force may dislodge some or all of the components free from the board. Such falling components are caught in a series of bins that are positioned below the moving boards.

The system is configured with a ventilation apparatus so that one or more operators may comfortably work in front of the moving boards. If any board nearing the end of the conveyor cycle still has any reclaimable components on it, an operator may manually remove any remaining components off of the board, while the bonding solder is still in a reflow state. No operator intervention may be necessary with respect to a given board when all of the components are dislodged by the tapper.

An object of the present invention is to implement a high volume component reclamation system. A feature of the invention is to have the boards automatically fed past IR panels to soften the solder bonding the leads of the components to the boards. The boards are also fed past a tapper which strikes the boards. An advantage of the system is that a number of boards can be processed at the same time, which substantially enhances the overall throughput of the system. Another advantage is that the tapper can dislodge some, and possibly all, of the components on a given board. The removal of components from the board by the tapper correspondingly reduces the operator's process time, with respect to that board, because some or all of the components are already off by the time the operator becomes involved for the purpose of removing the remaining components.

Other objects, features, and advantages of the invention will be further appreciated and better understood upon consideration of the following detailed description of the preferred embodiment, presented in conjunction with the accompanying drawings.

DETAILED DESCRIPTION OF THE PREFERRED EMBODIMENT

Throughout the following detailed description of the preferred embodiment a number of terms suggesting direction and position—such as front, back, top, and bottom—are used. Such references are based on the embodiment of the present invention shown in the figures. Moreover, such references are for convenient explanation only and should not be taken as a limitation of the invention.

Figure 1:
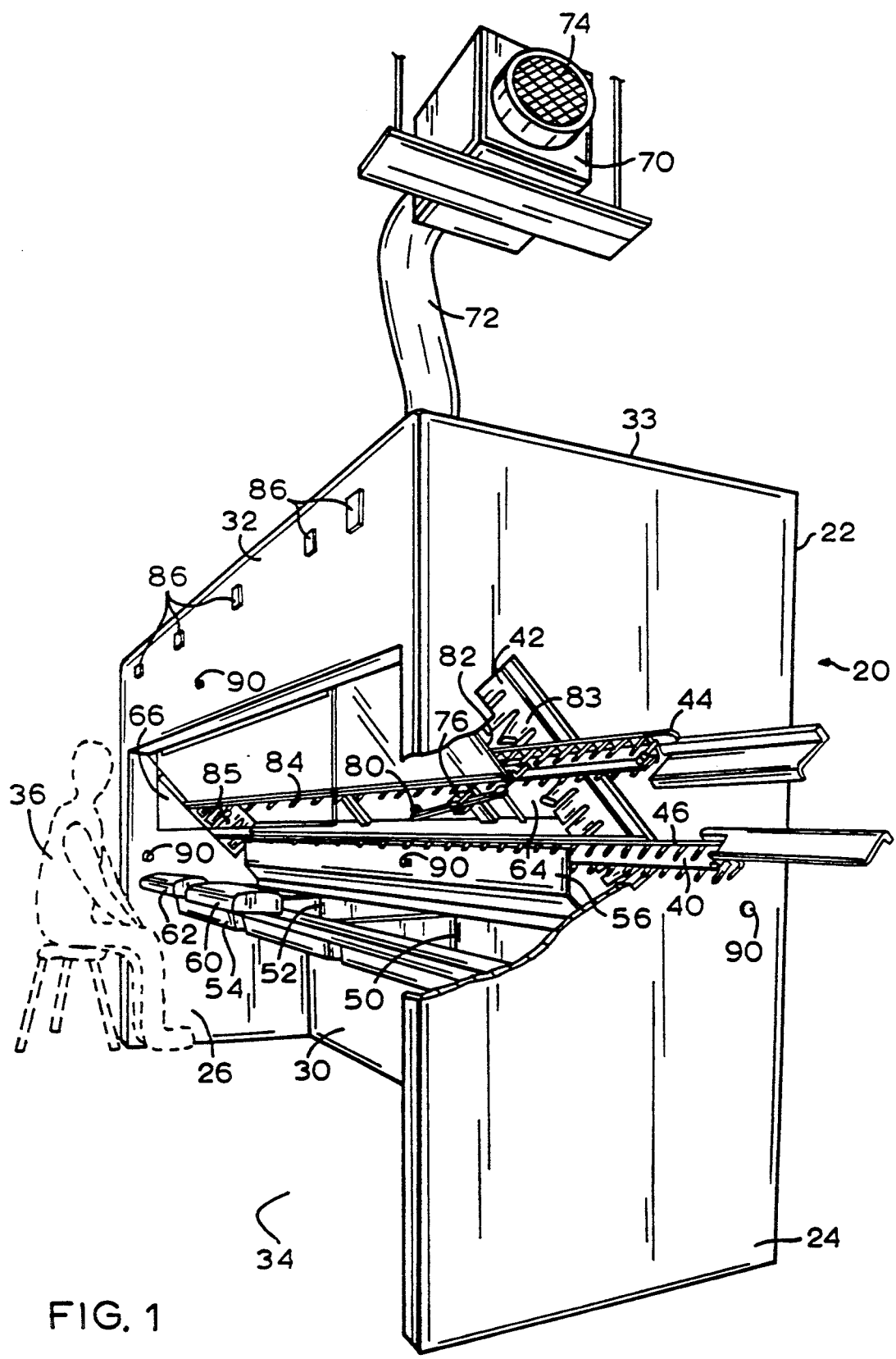
FIG. 1 is a partly sectioned, isometric drawing of an embodiment of the invention, shown with an operator, in phantom, seated at one of the operator stations.

FIG. 1 provides an overview of one embodiment of the present invention, showing a component reclamation system generally designated 20. System 20 includes a box-shaped cabinet 22 which measures approximately 10 feet long, 3 feet wide, and 6 feet high. The box-like shape of cabinet 22 includes side walls 24, 26, back wall 30, front wall 32, and top wall 33; however, only the very edges of top wall 33 are visible in FIG. 1. Walls 24, 26, 30, 32, 33 are formed of a commercially available, foamed, poly vinyl chloride, having a wall thickness of approximately 6 millimeters.

Although cabinet 22 is generally enclosed on all sides by walls 24, 26, 30, 32, 33, the configuration of the front of cabinet 20 provides for recess 34, which extends into the interior of the cabinet 22. In FIG. 1, one operator 36 is shown in phantom illustration to be seated at one of the two work stations in the front of cabinet 22. The outline of operator 36 gives an approximate scale of the dimension of cabinet 22.

Disposed within recess 34 in the front of cabinet 22 is conveyor 40, which is used to hold and move printed circuit boards (not shown in FIG. 1, but shown in FIG. 2 as reference numeral 104) that are processed by system 20. As seen in FIG. 1, conveyor 40 extends beyond side wall 24 through opening 42.

Conveyor 40 includes two, generally identical, spaced and parallel support rails 44, 46, which form the mechanical framework supporting the moving parts of conveyor 40. The parallel lines formed by support rails 44, 46 define an imaginary plane, such that a printed circuit board which is mounted on conveyor 40 lie within that plane. The precise pitch of the plane formed by support rails 44, 46 is not critical to the invention. As will be detailed below, however, it is desirable to have the component side of the board angled downwardly so that components on the board can drop off due to the force of gravity, while it is also desirable to have the component side of the board angled upwardly so that an operator 36 can manually remove components on the board if necessary. Accordingly, a range of pitches for the plane formed by support rails 44, 46 is 20–60 degrees in relation to a horizontal plane, with the preferred embodiment having a pitch of 45 degrees relative to the horizontal.

Conveyor 40 must be capable of reliably grasping and firmly holding a printed circuit board, preferably by its edges. In addition, conveyor 40 must be capable of cycling between room temperature, approximately 72 degrees Fahrenheit (F), occurring when system 20 is not operating, and 350°–400° F., occurring during normal operation of system 20. It has been useful to use a commercially available conveyor system manufactured by Hollis Automation, Inc. of Nashua, N.H., with a slight modification to enable the conveyor rails to expand, or "grow", as they are exposed to elevated temperatures during processing. In particular, the commercially available Hollis system was modified to include a spring (not shown) which accommodates the expansion of the conveyor rails by compressing when the rails are heated.

Beneath conveyor 40 are three identically configured catch bins 50, 52, 54. Each bin 50, 52, 54 is a rectangular tub with a substantial depression, positioned with its open side up so that components (also not shown in FIG. 1) which fall off of the printed circuits boards that are being moved along conveyor 40 are caught in the depression. Bins 50, 52, 54 are each lined with a nonconductive foam for protecting the components collected therein from static electricity. Extending up from the rear portion of bins 50, 52, 54 is fence 56. Fence 56 is an angled piece of sheet metal which is attached to cabinet 22 behind bins 50, 52, 54 and projects upward so that it reaches close to, but does not touch, support rail 46.

Positioned in front of bins 52, 54 are two identical resting pads 60, 62, which are compliant foam pads on which operator 36 may rest his or her arms while performing the tasks associated with the reclamation process. Resting pads 60, 62 generally define the two work stations at which an operator 36 is likely to be positioned during the reclamation process. In FIG. 1, only the recessed tub portion of bin 54, which is in front of operator 36, is visible due to the fact that the view of bin 54 is substantially obstructed by resting pads 60, 62.

System 20 further includes a heating or reflow means for causing the bond between the components and the printed circuit board to soften. In the preferred embodiment, system 20 includes IR panels 64 that are mounted end to end inside recess 34 so that they are positioned behind conveyor 40. In operation there are actually four IR panels mounted end to end; however, the four panels are not detailed in the drawings. IR panels 64 are angled so that the plane formed by IR panels 64 is generally parallel to the plane formed by rails 44, 46; therefore, they too are angled at 45 degrees relative to a horizontal plane, although the pitch of IR panels 64 could be varied along with the pitch of rails 44, 46, as discussed above.

The wavelength of the infrared radiation given off by IR panels 64 is between 4–6 microns, which is approximately the same infrared radiation given off by an ordinary fireplace. By using IR panels 64 having these radiation characteristics system 20 can be configured with the infrared radiation of IR panels 64 transmitted in the general direction of operator 26 without creating an unsafe condition. Although other IR panels may be suitable for this application, the IR panels sold by Vitronics Corporation of Newmarket, N.H. (part number 59817E30) have yielded satisfactory results.

The purpose of IR panels 64 is to heat the back sides of the printed circuit boards that are being moved along conveyor 40, so that the solder bonding the components onto the boards is made to reflow. When the solder bond reflows, the physical bond affixing the component to the board is substantially weakened. In some instances, the weakening of the physical bond is so much so that with the board angled down at 45 degrees the force of gravity may cause the component to fall off of the board and into bins 50, 52, 54.

Suspended from the upper portion of the opening established by recess 34 is a transparent, plexiglass-like shield 66, which is commercially available under the trademark "Lexan". Shield 66 is positioned to protect operator 36 from any spattering that may occur during the reclamation process. Furthermore, shield 66 assists with improving the comfort of operator 36 by tending to block and thereby direct the air that is heated during the operation of system 20 to the upper inside of cabinet 22.

Given that shield 66 is made of a transparent material, operator 36 is able to look through shield 66 and see any printed circuit boards that are being processed along conveyor 40. Furthermore, because shield 66 does not extend all the way down to touch the tops of resting pads 60, 62 operator 36 is able to extend his or her arms underneath the bottom edge of shield 66. With the arms of operator 36 rested against pad 60, or 62 if so positioned, operator 36 can comfortably work on the boards passing along on conveyor 40, while being able to clearly see what he or she is doing. It can now be seen that an excessive downward pitch to rails 44, 46, and thereby the boards mounted thereon, would make it difficult for operator 36 to work on them.

Although the air which is heated due to the reclamation process has a natural tendency to rise into the upper inside of cabinet 22, system 20 includes ventilator 70. Ventilator 70 has a fan system (not shown) which draws the air in the upper inside of cabinet 22 through flexible tube 72, which thereby provides the air channel between cabinet 22 and ventilator 70. Therefore, with the fan system operating a vacuum will be created in the upper part of cabinet 22 tending to draw the air mass which is settled in recess 34 up through tube 72. Ventilator 70 further includes a filter system (not shown) which filters the drawn air so that it can be recirculated into the room in which system 20 is operated. The filtered air is exhausted into the room through grate 74. A commercially available ventilation system sold by Rosco Industries of Haverhill, Mass. has proven suitable for this application.

Also positioned within recess 34, and situated between IR panels 64 and the back side of conveyor 40 is a means by which the passing boards are impacted, or mechanically shocked, so that the components can be dislodged and fall into bins 50, 52, 54. In the preferred embodiment the means for impacting the boards is tapper 76; however, impacting could be accomplished by means of a pneumatically operated or coil operated piston, or other similar means, which would cause sufficient mechanical shock to the board and vibration to dislodge the components.

Tapper 76 has an elongated bar 80, one end of which is positioned and operated to periodically tap the central portion of the back of the printed circuit boards that are passing by on conveyor 40. With the solder bonding the components to the boards softened due to the heat generated by IR panels 64, tapper 76 strikes the backs of the boards for the purpose of dislodging the components from the boards; however, the magnitude of that force will not be great enough to damage the boards.

Figure 4:
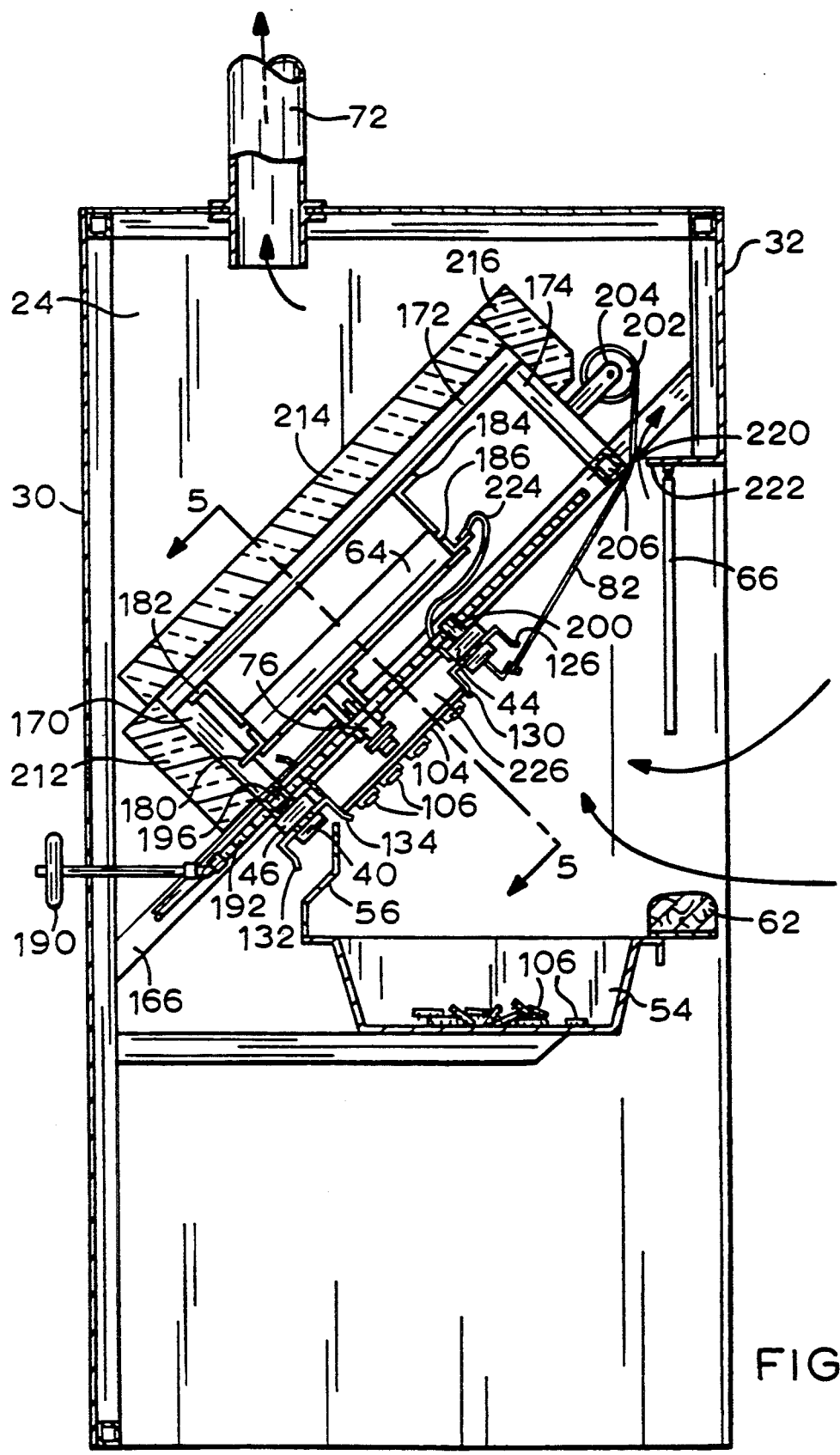
FIG. 4 is a side sectional view of the embodiment of FIG. 1 showing the angle of the conveyor and printed circuit boards, the IR panels and collection bins, as well as the ventilation system.

Referring to FIGS. 1 and 4, extending down from the upper inside of the opening defined by recess 34 is outer curtain 82. At its upper end outer curtain 82 extends into the top inside of cabinet 22, while at its lower end outer curtain 82 is pulled down so that it affixes to support rail 44. More particularly, at the lower end of outer curtain 82 is a metal, reinforcement strip 84. Reinforcement strip 84 extends the length of outer curtain 82 and provides a durable means of attaching outer curtain 82 to support rail 44. Outer curtain 82 is made of an aluminized fiberglass, such as the aluminized fiberglass material manufactured by and commercially available through the Carborundum Corporation of Niagra Falls, N.Y.

Outer curtain 82 tends to direct the air mass within recess 34 into the upper inside of cabinet 22 when ventilator 70 is operating, which creates a more comfortable working environment for operator 36.

At either end of conveyor 40, but within the confines of cabinet 22, system 20 includes side curtains 83, 85. As seen in FIG. 1, side curtains 83, 85 have been cut in a number of separate strips to provide a flexible, insulating enclosure for the portion of conveyor 40 which extends through side wall 24 and into cabinet 22. Like outer curtain 82, side curtains 83, 85 are made of an aluminized fiberglass material, which will bend and flex to accommodate the contours of the printed circuit boards as they are advanced into and exit out of cabinet 22 while being transported by conveyor 40.

Along the top front of cabinet 22 are control gages 86, that are for the purpose of controlling and showing the operating status of system 20. More particularly, control gauges 86 are for setting the operating temperature of the four IR panels 64, and then monitoring and controlling IR panels 64 to insure that they are operating within prescribed limits. Each control gauge 86 is coupled to a respective transducer (not shown) which is inside a respective IR panel 64 and which senses the operating temperature of the given IR panel 64.

For example, a typical operating temperature for the first IR panel 64, which would be the IR panel behind the printed circuit boards as they first enter cabinet 22 along conveyor 40, is approximately 373 degrees F. Typical operating temperatures for the second, third, and fourth IR panels 64, positioned beside each other, are approximately 398, 368, and 310 degrees F., respectively.

Referring specifically to the first IR panel 64, with its temperature set at target temperature of 373 degrees F., its control gauge 86 will cause the first IR panel 64 to turn off if its temperature rises beyond this target temperature, plus or minus some margin of tolerance which can be adjusted, but is set to vary only a few degrees. Correspondingly, if the temperature drops below the established margin, control gauge 86 will turn on the first IR panel 64. Consequently, during normal operations, control gauges 86 will be constantly turning their respective IR panels 64 on and off in order to adjust their temperatures. As shown in FIG. 1, control gauges 86 further provide a readable display of the temperature information. Although others may be used, control gauges sold through Maltz Sales of Stoughton, Mass. have proven satisfactory for this application.

Also shown in FIG. 1, positioned in close, convenient reach on four different places on cabinet 22 are four, identical, emergency stop buttons 90, which can be activated to stop system 20, including conveyor 40 and IR panels 64 in the event of an emergency.

Figure 2:
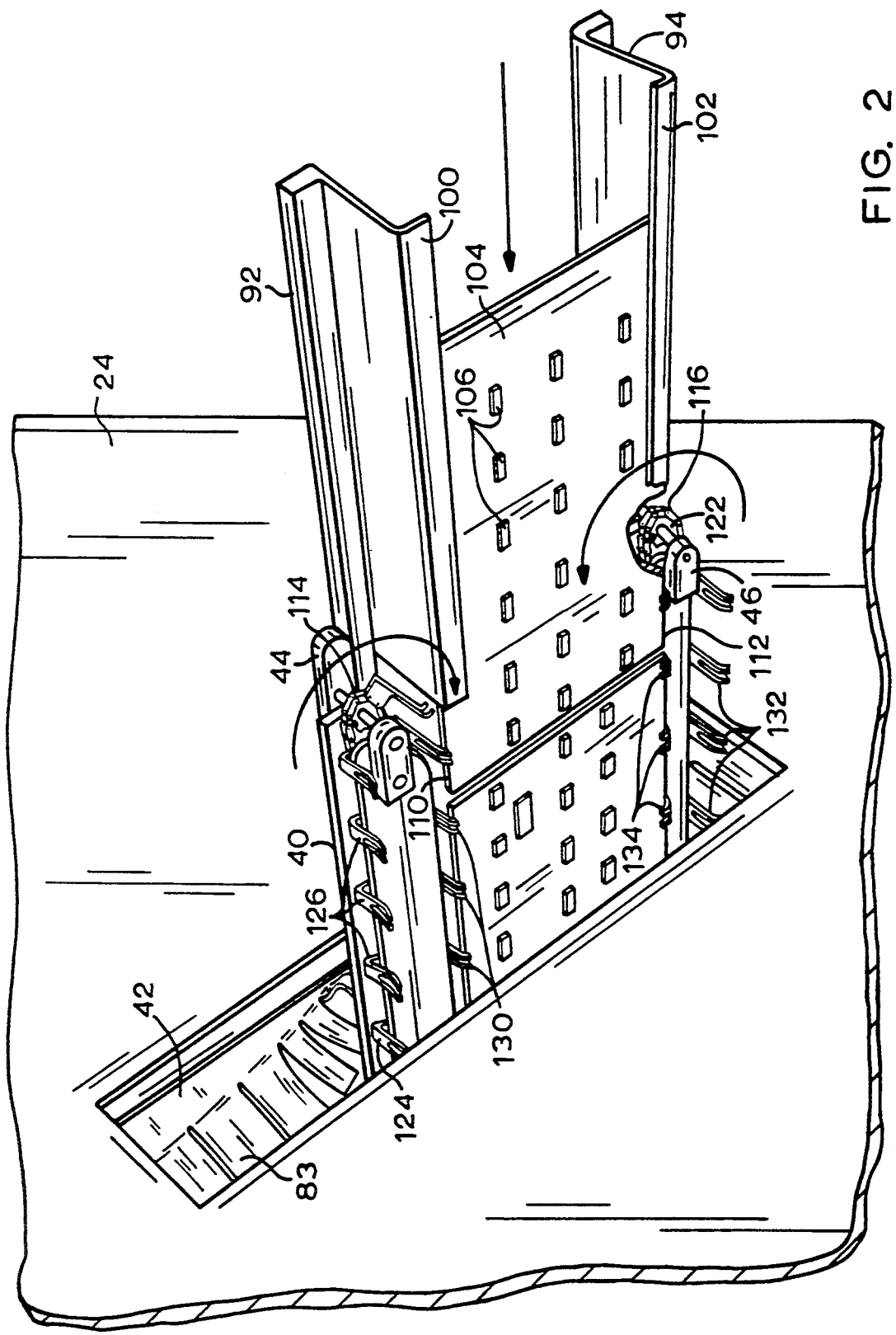
FIG. 2 is an partly sectioned, isometric, fragmented view of a portion of the embodiment of FIG. 1 showing printed circuit boards initially loaded onto the conveyor.

Referring now to FIG. 2, a partially sectioned, isometric, fragmented view of the portion of conveyor 40 onto which boards are loaded is shown in greater detail. As shown, support rails 44, 46 extend through side wall 24 of cabinet 22, past side curtain 83, and into recess 34. At the outer extremity of the beginning of conveyor 40 are two, generally identical, spaced and parallel feeder rails 92, 94. Feeder rails 92, 94 are each made of a bent, or formed, piece of metal, which, when cut in a cross section, is approximately in the shape of a square letter "S". Feeder rail 92 is attached to and serves as an extension of support rail 44, and feeder rail 94 is likewise attached to and serves as an extension of support rail 46. As seen in FIG. 2, the lower bent portion of feeder rails 92, 94 define support lips 100, 102, which each form an extended, flat surface against which two opposite edges of printed circuit board 104 can be positioned.

Each circuit board 104 has a plurality of electronic components, generally designated 106, mounted on one side. As shown, components 106 are typically mounted on circuit board 104 by means of solder bonds which physically and electrically connect the leads of a given component 106 to the conductive circuitry of circuit board 104. As will be detailed below, an objective of system 20 is to heat the solder bond which connects component 106 to circuit board 104 to a point at which the solder bond is made to reflow so that component 106 can be easily dislodged or removed from circuit board 104.

As stated above, in the preferred embodiment of the invention support rails 44, 46 of conveyor 40 are angled at 45 degrees relative to a horizontal plane. Correspondingly, feeder rails 92, 94 are also angled at 45 degrees such that when circuit boards 104 are mounted on feeder rails 92, 94 circuit boards 104 will be disposed at an angle of 45 degrees relative to a horizontal plane.

As shown in FIG. 2, circuit boards 104 are mounted on feeder rails 92, 94 by having the component side of circuit board 104 facing downward, and the upper edge 110 and lower edge 112 of circuit board 104 positioned against supporting lips 100, 102, respectively. Supporting lips 100, 102 thereby provide the extended support surfaces against which circuit boards 104 are initially positioned before they are advanced into the moving parts of conveyor 40. Although it is not required, it is desirable to have the length of feeder rails 92, 94 great enough so that the entire length of circuit board 104 can be positioned against supporting lips 100, 102. Such complete support of circuit board 104 assists in properly aligning upper and lower edges 110, 112 with the moving parts of conveyor 40.

The moving parts of the conveyor system 20 includes upper and lower chains 114, 116, which are respectively supported by support rails 44, 46. Chains 114, 116 are carried on and revolve around upper sprocket 120 and lower sprocket 122, respectively, as indicated by the curved arrows on FIG. 2. Sprockets 120, 122 are each mounted on a hub which is respectively supported by support rails 44, 46. Sprockets 120, 122, respectively, thereby establish one of the points at which chains 114, 116 reverse direction.

Although not detailed in any of the drawings, conveyor 40 similarly has upper and lower sprockets which are mounted on hubs which are respectively supported by support rails 44, 46 at the far end of conveyor 40, as seen in the view provided in FIG. 1. Being supported by support rails 44, 46 and carried on their respective sprockets 120, 122, chains 114, 116 both move at the same rate along the entire length of cabinet 22.

As will be discussed further in connection with the block diagram of FIG. 6, conveyor 40 includes a variable rate motor which can be adjusted to change the speed at which chains 114, 116 carry circuit boards 104 past IR panels 64, shown in FIG. 1. Accordingly, if a given group of circuit boards 104 require a longer period of time to reflow the solder bonding components 106 to circuit board 104, the motor could be slowed down so that circuit boards 104 would be exposed to IR panels 64 for a longer period of time. Or, if another group of circuit boards 104 required less exposure, the motor speed could be increased to improve the throughput of system 20. A typical operating speed of the embodiment of the invention is approximately 2 feet/minute.

Affixed to each chain 114, 116 are a plurality of identical, evenly spaced clasping forks 124. Forks 124 are made of a stainless steel, and are formed such that the furcations of a given fork 124 can elastically bend and securely clasp the upper and lower edges 110, 112 of circuit board 104, as will be detailed below.

Each chain 114, 116 includes an inner and outer row of forks 124. For example, chain 114 has outer fork row 126, which is made up of forks 124 which are moving in the direction toward the outside of cabinet 22, as shown in FIG. 2. The inner fork row 130 of chain 114 is made up of forks 124 that have revolved around upper sprocket 120 and are moving in a direction toward the inside of cabinet 22. Given that chain 114 is one continuous unit, which moves during the operation of system 20, the forks 124 that comprise outer fork row 126, at one point in time, will become the forks 124 that comprise the inner fork row 130 after they revolve around sprocket 120.

Correspondingly, lower chain 116 has an outer fork row 132, and an inner fork row 134. Outer and inner fork rows 132, 134 of lower chain 116 operate in the same manner as fork rows 126, 130 of upper chain 114, except that they revolve around sprocket 122.

With respect to upper chain 114, as any given fork 124 on outer fork row 126 revolves around upper sprocket 120 to become positioned on inner fork row 130, it moves in a rotating downward motion, until it fully revolves around upper sprocket 120, at which point its downward motion ceases. Correspondingly, with respect to lower chain 116, as any given fork 124 on outer fork row 132 revolves around lower sprocket 122 to become positioned on inner fork row 134 it moves in a rotating upward motion, until it fully revolves around lower sprocket 122, at which point its upward motion ceases. As the forks 124 on upper chain 114 move downward, and the forks 124 on lower chain 116 move upward, the distance separating opposing forks 124 on inner row 130 and inner row 134 gets smaller until they rotate fully about their respective sprockets. Consequently, circuit boards 104 are mounted on conveyor 40 by placing them between forks 124 on upper chain 114 as they are moving downward and lower chain 116 as they are moving upward.

More particularly, circuit boards 104 are mounted on conveyor 40 by first positioning circuit board 104 against support lips 100, 102, and then sliding circuit board 104 into the moving conveyor 40. As this happens, the very end of upper edge 110 and lower edge 112 will be grasped between a downwardly moving fork 124 on upper chain 114, and an upwardly moving fork 124 on lower chain 116. In this respect, the upper and lower edges 110, 112 get securely pinched between forks 124, due to the elastic qualities of forks 124. Such secure pinching of circuit board 104 is necessary for transporting it along conveyor 40. In addition, it is also necessary to have circuit board 104 held securely enough so that it is not forced out of the grasp of conveyor 40 as it is subjected to the striking impacts of tapper 76.

As inner fork rows 130, 134 continue their movement in toward the inside of cabinet 22, they will have a tendency to draw circuit board 104 further into conveyor 40. Simultaneously, other downwardly moving forks 124 on upper chain 114, and other upwardly moving forks 124 on lower chain 116 will continue to pinch upper and lower edges 110, 112 at other points, also drawing circuit board 104 into cabinet 22. Progressively circuit board 104 will be supported less and less by support lips 100, 102 until it is eventually completely supported by and held between forks 124 of inner fork rows 130, 134.

Figure 3:
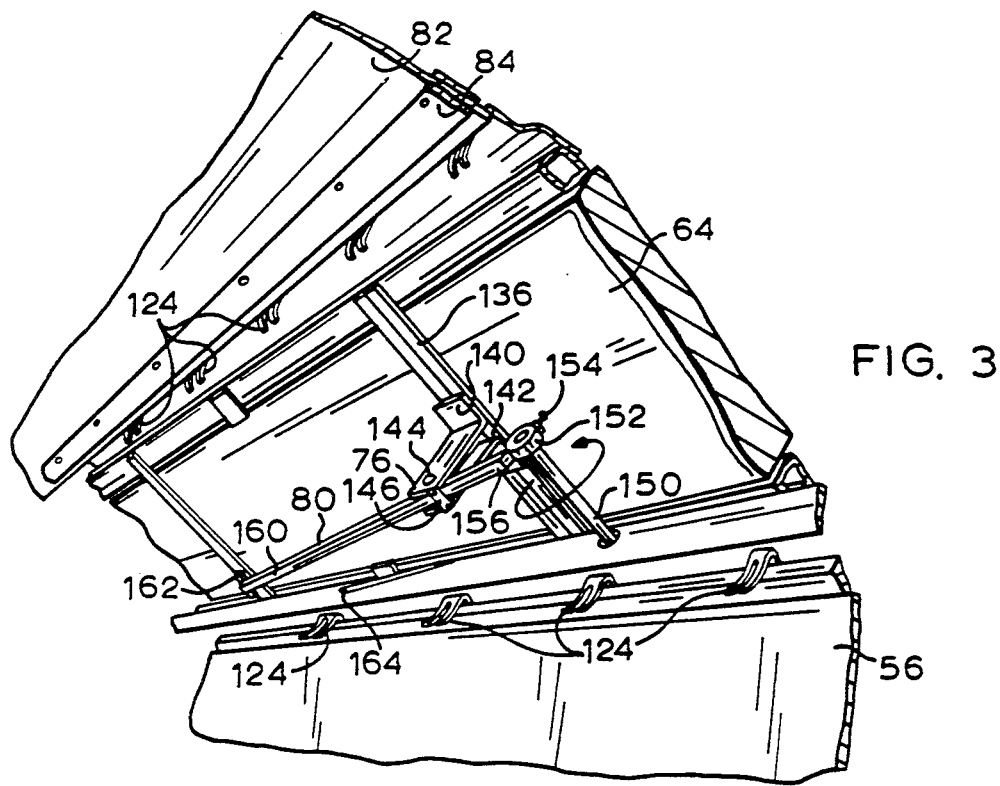
FIG. 3 is an isometric, fragmented view of a middle section of the embodiment of FIG. 1, generally showing portions of the conveyor system and the IR panels, and the tapper.

Referring now to FIG. 3, IR panels 64 and tapper 76, first discussed in connection with FIG. 1 are shown in enhanced detail. IR panels 64 are positioned so that as circuit boards 104 (not shown in FIG. 3) are grasped and moved by forks 124, the backside of each circuit boards 104, which is the side without any components 106, will be facing IR panels 64. Also positioned so that it is facing the backsides of circuit boards 104 is tapper 76. Tapper 76 is mounted on frame member 136, which is part of the support framework of cabinet 22. Frame member 136 is angled such that it is generally parallel to the plane formed by IR panels 64, which in this embodiment of the invention is 45 degrees relative to a horizontal plane.

Tapper 76 includes two, identical, angled braces 140, 142 which are affixed to frame member 136. Angled braces 140, 142 respectively have a section which extends down from frame member 136 and which are parallel with and spaced from one another. Elongated bar 80 is attached to and suspended from angled braces 140, 142 by means of a suspension rod 144 which extends between angled brace 140 and angled brace 142.

Elongated bar 80 is positioned between the space separating angled braces 140, 142. Suspension rod 144 is inserted in a hole in elongated bar 80 and also inserted through and secured in holes in the lower end of angled braces 140, 142. Although the spacing of angled braces 140, 142 and elongated bar 80, and the spacing of the hole in elongated bar 80 and suspension rod 144 are of a close tolerance, that spacing is not so tight that the free pivoting movement of elongated bar 80 around suspension rod 144 is impeded. The exact point at which suspension rod 144 goes through elongated bar 80, relative to the center of elongated bar 80, is not critical; however, it is desirable to position it off center, so that the far end of elongated bar 80, as shown in FIG. 3, has a natural tendency to hang down.

Also connecting angled braces 140, 142 at their lower ends is stop tab 146. Stop tab 146 is a relatively short, straight piece of metal which attaches to the undersides of the ends of angled braces 140, 142, and is positioned to make contact with a middle portion of the underside of elongated bar 80, when elongated bar 80 is fully pivoted downward around suspension rod 144. Accordingly, when elongated bar 80 is pivoted downward, the extent of its downward pivoting will be limited by the contact of elongated bar 80 with stop tab 146, provided there are no circuit boards 104 mounted between forks 124 and positioned in front of tapper 76.

Also seen on FIG. 3, is axle 150 which is attached to a motor (not shown in FIG. 3, but shown in block diagram form in FIG. 6) which rotates axle 150 at a predetermined rate. As will be detailed below in connection with the block diagram of FIG. 6, the motor is controlled by a controller which can vary the rate of rotation. Accordingly, the number of times that the passing circuit boards 104 are struck can be adjusted to the desired number, based on the speed of conveyor 40 and the length of circuit boards 104.

Affixed at one end of axle 150 is collar 152, which is a ring shaped piece of metal which has a screw 154 disposed in a screw hole (not detailed). The positioning of collar 152 relative to elongated bar 80 is such that as collar 152 rotates on axle 150, screw 154 contacts lifter end 156 of elongated bar 80 and acts as a cam lifter. As collar 152 continues to rotate in contact with lifter end 156, screw 154 downwardly displaces lifter end 156. The downward displacement of lifter end 156 will correspondingly cause the other end of elongated bar 80, striker end 160, to rise upward, as elongated bar 80 pivots around suspension rod 144.

Then, as collar 152 continues to rotate further, screw 154 will rotate out of contact with lifter end 156. Lifter end 156 will thereby return to its normal raised position as striker end 160 of elongated bar 80 abruptly drops to its normal downward position. As indicated above, the downward movement of elongated bar 80 will be restricted by stop tab 146, provided there are no circuit boards 104 positioned in front of tapper 76. If circuit boards 104 are positioned in front of tapper 76, then the downward movement of elongated bar 80 will be limited by the contact of striker end 160 with the backsides of circuit boards 104. Moreover, if circuit boards 104 are positioned in front of tapper 76, then striker end 160 will rest against the backs of circuit boards 104 as they are passing by, and elongated bar 80 will not make contact with stop tab 146. Striker end 160 will however continue to periodically rise and then drop to strike the backs of circuit boards 104 as collar 152 and screw 154 continues the rotary movement.

Affixed to the top side of elongated bar 80 at striker end 160 is tapper weight 162. Tapper weight 162 is a block of metal which is added to striker end 160 of elongated bar 80 for the purpose of augmenting its mass and thereby increasing the striking force of elongated bar 80 when it drops against the back of circuit board 104. In this embodiment of the invention, tapper weight 162 is approximately 1.5 lbs., which delivers a striking force is of approximately 0.40 lbs. The exact mass of tapper weight 162 may vary in other embodiments of the invention, the objective of choosing alternative weights being to select a mass that provides as great a striking force as possible without damaging circuit boards 104.

As shown in FIG. 3, system 20 further includes thermocouple 164 which is positioned in front of IR panels 64, but behind the plane formed by support rails 44, 46 of conveyor 40. Therefore, when conveyor 40 is loader with circuit boards 104, as shown in FIG. 2, thermocouple 164 will be positioned between the backsides of circuit boards 104 and IR panels 64. As discussed above, although control gauges 86 turn IR panels 64 on and off on the basis of the selected temperature setting, thermocouple 164 provides a safety backup to that control system. More specifically, if control gauges 86 fail to properly control the temperature of IR panels 64, and the temperature increases beyond an established limit, thermocouple 164 will sense that elevated temperature and through its control mechanism it will shut down system 20.

Referring now to FIG. 4, a side sectioned view of system 20 shows a number of internal features of the embodiment of the invention. The view furnished in FIG. 4 results from sectioning the end of cabinet 22 which is adjacent to side wall 26 and looking inside.

With respect to the inner framework of cabinet 22, there is a large diagonal brace 166, running diagonally from back wall 30 to front wall 32. Additionally, cabinet 22 includes frame members 170, 172, 174, which provide the support structure for IR panels 64. Three edges of one IR panel 64 are mounted on frame members 170, 172 by means of panel braces 180, 182, 184 with the fourth edge of IR panel 64 also having panel brace 186.

In FIG. 4 it can be seen that in the preferred embodiment the angling of conveyor 40 and IR panels 64 are generally at 45 degrees. Circuit board 104, which is mounted on conveyor 40, is similarly angled at 45 degrees and is positioned so that the side of circuit board 104 which has components 106 on them are facing downward. The backsides of circuit board 104 is facing IR panel 64.

Extending out of the backside of cabinet 22 is adjustment wheel 190, which is attached to adjustment screw 192 by means of universal joint 194. Consequently, as adjustment wheel 190 is turned, adjustment screw 192 will turn as well. As shown on FIG. 4, adjustment screw 192 is a large, threaded bolt which extends upwardly from universal joint 194 at approximately 45 degrees relative to a horizontal plane. Adjustment screw 192 extends through an unthreaded hole (not detailed) in frame member 196, and engages a threaded hole (not detailed) in rail mount 200. Support rail 44 is attached to rail mount 200.

When adjustment wheel 190 is turned and adjustment screw 192 correspondingly turns, the engagement of adjustment screw 192 with the threaded hole in rail mount 200, will cause rail mount 200 to move up or down. Given that support rail 44 is attached to rail mount 200, support rail 44 will likewise move up or down. Although from the view rendered in FIG. 4 only the very side of support rail 44 is seen, it should be understood that when adjustment wheel 190 is turned, the entire length of support rail 44, as best seen in FIG. 1, will be adjusted up or down.

In addition, although it is not detailed in any of the drawings, conveyor 40 is configured with a similar adjustment screw on the opposite side of cabinet 22 as shown in FIG. 4, namely the side enclosed by side wall 24 as shown in FIG. 1. The second adjustment screw, which is not shown, is mechanically linked to adjustment wheel 190 so that as adjustment wheel 190 turns, the second adjustment screw will turn the exact amount as adjustment screw 192. Furthermore, the second adjustment screw likewise works in registration with a corresponding threaded hole in a corresponding rail mount. Through the precise linkage of the adjustment screws with adjustment wheel 190, the level position of support rail 44 will be preserved when it is adjusted by adjustment wheel 190.

Support rail 46 is firmly attached to frame member 196, and therefore is stationary and unaffected by the turning of adjustment wheel 190. However, when support rail 44 is adjusted up or down, the distance separating support rails 44, 46 will change according to the extent of the adjustment. Importantly, the precise and coordinated movement of adjustment screw 192 with the other adjustment screw assures that the parallel spacing of support rails 44, 46 is preserved in spite of the adjustment up or down.

The advantage of being able to adjust the distance between support rails 44, 46 is that system 20 is thereby capable of accommodating circuit boards 104 of varying sizes, provided circuit boards 104 are not so large that they exceed the outer extension of the adjustment screws. It should be noted that because feeder rail 92 is attached to support rail 44 and feeder rail 94 is attached to support rail 46, the parallel separation of feeder rail 92 in relation to feeder rail 94 will likewise be determined by the movement of adjustment wheel 190.

As seen in FIG. 4, below circuit board 104 is bin 54, which has a number of components 106, which have been reclaimed through the operation of system 20. Positioned adjacent to bin 54 is resting pad 62. On the side of bin 54 which is opposite to resting pad 62, is fence 56, which extends upward. Due to the 45 degree angling of support rail 46, the upper portion of fence 56 extends in between the generally downwardly extending outer fork row 132 and inner fork row 134. As stated above, fence 56 does not actually touch any part of conveyor 40; however, the close proximity allows for very little space between fence 56 and conveyor 40.

At the lower end of outer curtain 82 reinforcement strip 84 attaches to support rail 44. At the upper end, outer curtain 82 is wrapped around spool 202, which is mounted on spool mount 204 affixed to frame member 174. Although considerably larger and more durable, the configuration and operation of spool 202 is similar to a coil spring activated window shade. Like a window shade, there is a natural tendency for spool 202 to recoil such that outer curtain 82 will wrap around spool 202 when support rail 44 is raised through adjustment wheel 190. In addition, when adjustment wheel 190 lowers support rail 44, spool 202 will uncoil under spring tension, thereby keeping the fabric of outer curtain 82 pulled taut so that it provides a generally smooth, even surface leading up to the top of cabinet 22.

Between the lower portion of outer curtain 82, which is attached to support rail 44, and the upper portion of outer curtain 82, which is wound around spool 202, outer curtain 82 extends across frame member 206. The surface of frame member 206 which makes contact with outer curtain 82 is generally smooth so that outer curtain 82 is not excessively abraded by its contact with frame member 206 when it is raised and lowered.

As seen from the side view of FIG. 4, in the top of cabinet 22 is a substantially enclosed, ventilation chamber 210, which is generally defined by side walls 24, 26, back wall 30, front wall 32, top wall 33, and insulation panels 212, 214, 216. There is, however, a ventilation opening 220 in ventilation chamber 210 which is defined by an elongated passage, created by the separation of inward projection of recess edge 222 and frame member 206, which is covered by outer curtain 82. Due to the side view shown in FIG. 4, the full length of ventilation opening 220 is not seen; however, as better visualized from the view shown in FIG. 1, ventilation opening 220 extends the full length of outer curtain 82.

Referring back to FIG. 4, when ventilator 70 is operational, the vacuum force created by ventilator 70 will draw the air in ventilation chamber 210 out through tube 72. As the air is drawn out of ventilation chamber 210, a vacuum force will be created across ventilation opening 220 tending to draw air upward into ventilation chamber 210. Consequently, the air mass that is somewhat enclosed by shield 66, catch bins 50, 52, 54, fence 56, circuit boards 104, outer curtain 82, and side walls 24, 26, as shown in FIGS. 1 and 4, will be drawn up into ventilation chamber 210. This vacuum effect will tend to draw the ambient air in the front of cabinet 22, which is the area in which operator 36 is positioned. Consequently, a comfortable temperature can be maintained for operators 36 working in front of system 20, as shown in FIG. 1.

As indicated above, insulation panels 212, 214, 216 partially define the walls of ventilation chamber 210. In addition, as seen in FIG. 4, they substantially surround three sides of IR panels 64. Insulation panels 212, 214, 216 are a low density, ceramic fiber insulation which is commercially available from the Carborundum Corporation of Niagra Falls, N.Y. under the brand name Dura-board (LD). Due to their insulative properties they tend to retain the heat generated by the operation of IR panels 64.

In addition, the heat generated by IR panels 64 is retained by inner curtain 224, which is attached at one of its ends to panel brace 186 and is attached at its other end to support rail 44. Inner curtain 224 is made of an aluminized PBI, which is the same type of material out of which firefighting suits are made and which is sold through the Globe Firefighting Company of Pittsfield, N.H. Therefore, inner curtain 224 is highly reflective of the heat generated by IR panels 64. Furthermore, the material has the same flexible characteristics of a heavy duty canvass fabric. Consequently, when support rail 44 is raised and lowered by adjustment wheel 190, the heat shield provided by inner curtain 224 flexibly bends and adjusts in accordance with the height of support rail 44.

The combined insulative properties of insulation panels 212, 214, 216, inner curtain 224, and the enclosure toward the ends of conveyor 40 by side curtains 83, 85 insures that the heat that is radiated by IR panels 64 at the back sides of circuit boards 104 will be largely retained in heat chamber 226. Heat chamber 226 is generally defined by the front of IR panels 64, the back of circuit boards 104, insulation panel 221, inner curtain 224, and side curtains 83, 85, shown in FIG. 9.

In the preferred embodiment of the invention, although IR panels are capable of heating up to 1000 degrees F., the temperature in heat chamber 226 typically ranges from approximately between 350–400 degrees F. This range has been found to be adequate to cause the solder on circuit boards 104 to reflow. As discussed above, a more exact setting of the temperature in heat chamber 226 can be controlled through control gauges 86.

Finally with respect to FIG. 4, a side view of tapper 76 is provided, revealing the positioning of tapper 76 between IR panels 64 and circuit boards 104.

Figure 5:
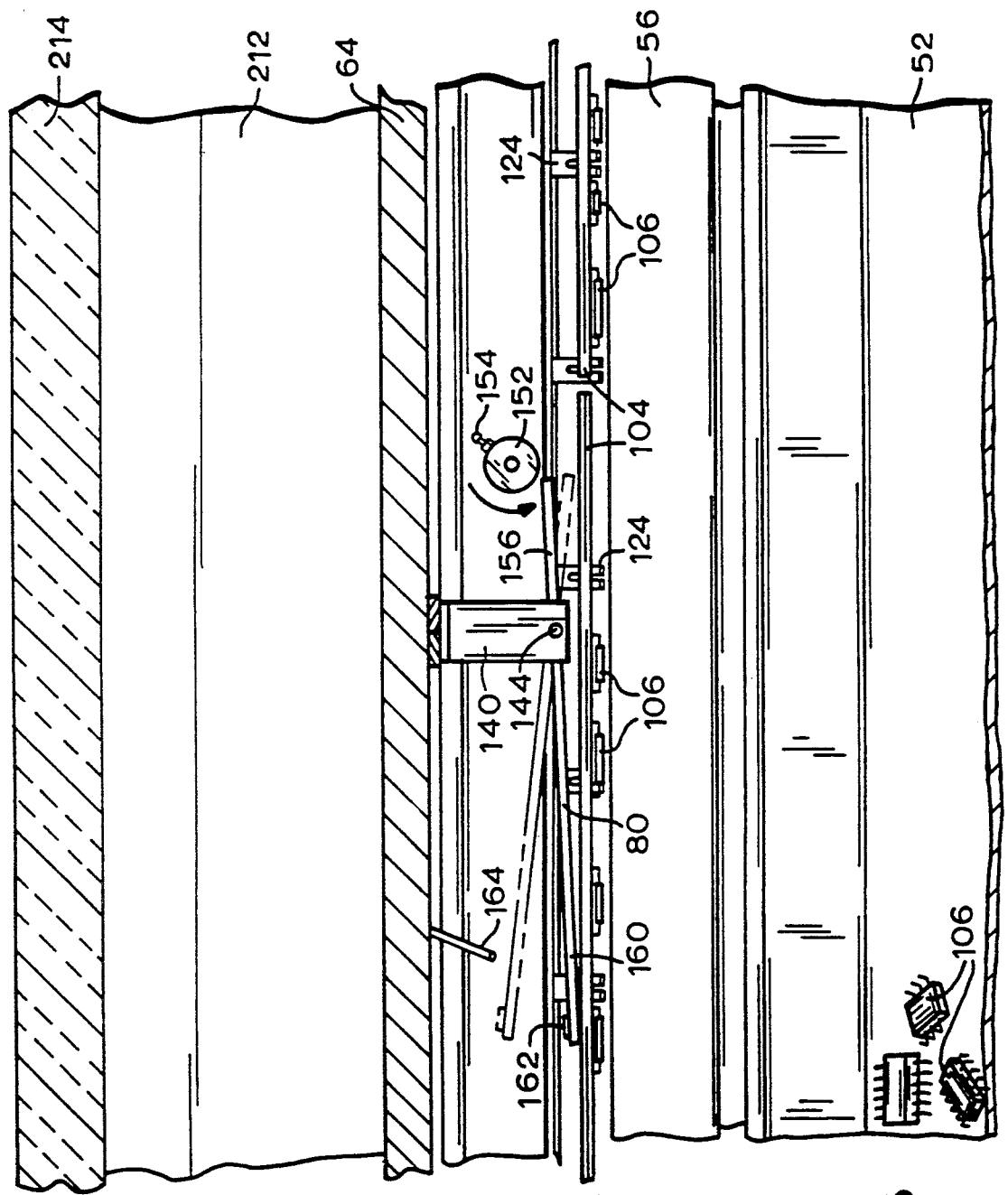
FIG. 5 is a sectioned, top view of the embodiment of FIG. 1, showing boards passing through the tapper zone, with the movement of the tapper shown in phantom, and a number of components which have fallen into the collection bins.

Referring now to FIG. 5, a fragmented, sectioned, top view of the middle portion of system 20 is provided. This illustration focuses upon the same general, middle portion of system 20 as shown in FIG. 3; however, the view better shows the dynamic operation of tapper 76 together with circuit boards 104. Strictly speaking, FIG. 4 is a modified top view of system 20, which has been created by sectioning the middle portion of system 20 and circuit boards 104, with an imaginary plane which has Line 5—5 of FIG. 4 lying within it and which is perpendicular to the plane formed by circuit boards 104 grasped by forks 124.

As indicated above, the middle portion of elongated bar 80 pivots around suspension rod 144, which is attached at either end to angled braces 140, 142. Only angled brace 140 is visible in FIG. 5, while angled brace 142 is shown in FIG. 3. With collar 152 rotating in the manner indicated by the arrow in FIG. 5, screw 154 will make contact with lifter end 156 and displace it downward. As lifter end 156 is displaced downward, striker end 160 will correspondingly be lifted upward. In FIG. 5 the downward movement of lifter end 156 and the upward movement of striker end 160 is shown through a broken line illustration of elongated bar 80.

As collar 152 continues its rotary motion, screw 154 will eventually be rotated out of contact with lifter end 156. When that happens striker end 160, which is heavier than lifter end 156 due to the fact that suspension rod 144 is not disposed through the center of elongated bar 80, and also due to tapper weight 162, will drop onto the backs of circuit boards 104. The impact of the striking force of tapper 76 will tend to dislodge components 106 from circuit board 104, given that the solder bond between components 106 and circuit board 104 will have been made to reflow due to the heat directed at circuit boards 104 by IR panels 64. Components 106 dislodged from circuit boards 104 fall into bin 52, or possibly bins 50, 54, from which components 106 can be collected.

Figure 6:
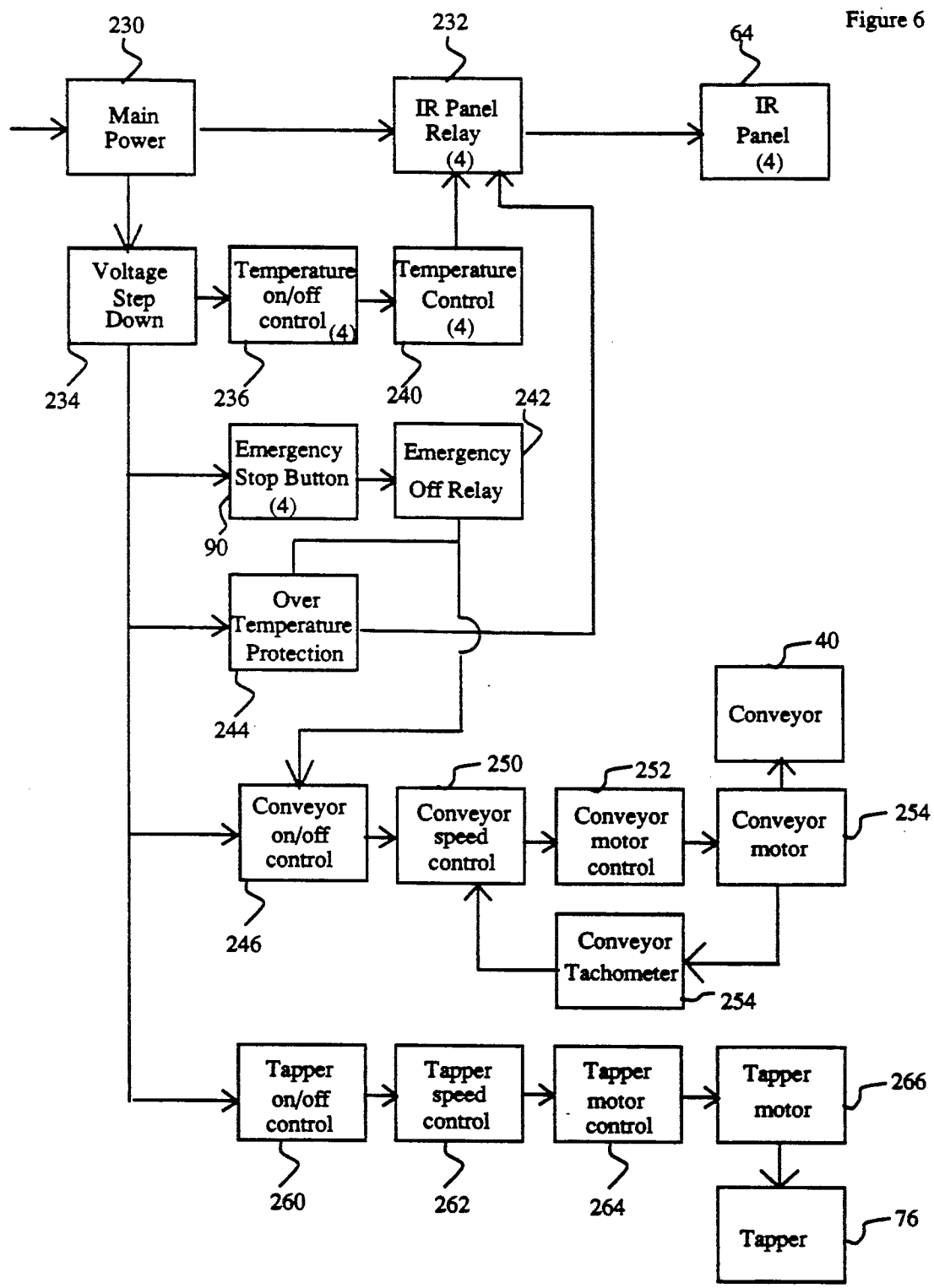
FIG. 6 is a block diagram showing the interrelation of the major system components that are included in the embodiment of the invention shown in FIG. 1.

Referring now to FIG. 6, a general block diagram of the major system components of the embodiment of the invention are shown. In FIG. 6, system 20 has a main power panel 230 which is connected to a power source, such as the power source of the building in which system 20 is situated. The voltage leading out of main power panel 230 is 480 volts of alternating current (VAC), which powers IR panels 64 through IR panel relay 232. IR panel relay 232 is responsible for turning IR panels 64 on and off. Although FIG. 6 includes only one block for IR panel relay 232 and one block for IR panel 64, it should be understood that in the preferred embodiment of the invention there are actually four IR panels 64, and each IR panel 64 has its own separately controlled and operated IR panel relay 232.

The main power panel 230 is also connected to transformer 234, which converts the 480 VAC to 110 VAC, which can then be used to power the other system components. Transformer 234 powers temperature on/off control 236 which in turn determines if the power to temperature control 240 is on or off. Temperature control 240 includes a thermocouple inside each IR panel 64 which is the sensor responsible for determining whether a given IR panel 64 is operating in its proper temperature range. Consequently, each of the four temperature controls 240 are connected to a respective IR panel relay 232 in order that the given temperature control 240 can instruct its respective IR panel relay 232 to turn its respective IR panel 64 on or off in response to the actual temperature. Again, although FIG. 6 includes only one block for temperature control on/off 236 and temperature control 240, respectively, it should be understood that each IR panel 64 has its own such control arrangement.

Transformer 234 is connected to emergency off relay 242 through emergency stop buttons 90, shown on FIG. 1. If an operator 36 were to notice any condition which would recommend stopping the system 20, any one of the emergency stop buttons 90 could be pushed, which will activate emergency off relay 242, as well as an emergency light (not shown). Emergency off relay 242 will signal over temperature protection 244, which in turn will signal IR panel relay 232 to turn off IR panels 64. In addition, emergency off relay 242 also signals conveyor on/off control 246 to turn off conveyor 40. Once an emergency button 90 is pushed, system 20 can only be reactivated by resetting the system in a main power panel.

As discussed above, in the interest of providing safety redundancy, transformer 234 powers over temperature protection 244, which includes thermocouple 164, shown on FIGS. 3 and 5, for sensing the temperature of heat chamber 226. Over temperature protection 244 is connected to IR panel relay 232 such that if over temperature protection 244 were to sense a temperature which exceeds the established limits, it would signal to IR panel relay 232 to turn off IR panels 64.

Conveyor on/off control 246, powered by transformer 234, determines whether conveyor speed control 250 is on or off. Conveyor speed control 250 determines and regulates the amount of voltage that must be sent to conveyor motor control 252 in order to move conveyor 40 at the desired speed. Conveyor motor control 252 takes the power received from conveyor speed control 250 and converts the alternating current to direct current, which is then supplied to conveyor motor 254. Conveyor motor 254 moves conveyor 40 in order to carry circuit boards 104 past IR panels 64, as shown and discussed in connection with FIGS. 1-5.

As shown in FIG. 6, conveyor motor 254 is connected to conveyor tachometer 256, which monitors the actual speed of conveyor motor 254. Conveyor tachometer 256 then provides that speed data back to conveyor speed control 250, which will adjust the voltage going to conveyor motor control 252 to make conveyor motor 254 move conveyor 40 at the desired speed.

Transformer 234 also powers tapper on/off control 260, which determines whether tapper speed control 262 is on or off. Tapper speed control 262 determines and regulates the amount of voltage that must be sent to tapper motor control 264 to operate tapper 76 at the desired speed. Tapper motor control 264, which in the preferred embodiment is a model ASH 550 available through Bodine Motors and Controls of Somerville, Mass., takes the power received from tapper speed control 262 and converts the alternating current to direct current. The direct current is supplied to tapper motor 266, which in turn rotates axle 150 and collar 152 to periodically raise and lower elongated bar 80, shown and discussed in connection with FIGS. 3 and 5.

Figure 7:
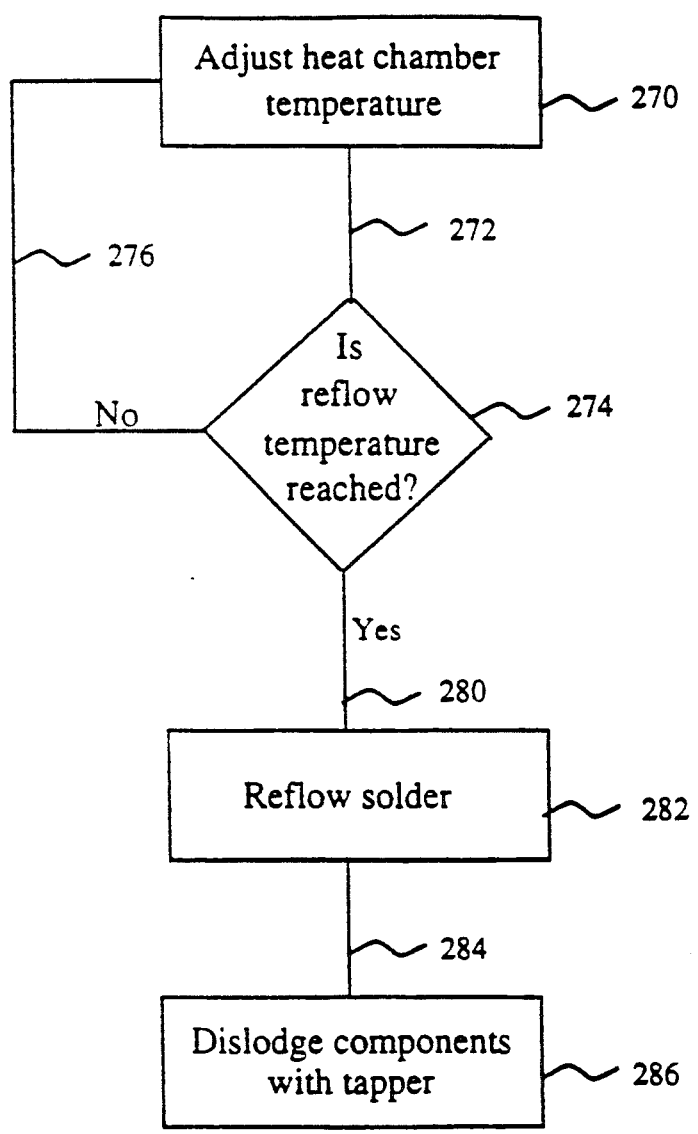
FIG. 7 is a flow diagram generally depicting the method by which the embodiment of the invention shown in FIG. 1 is implemented.

Referring now to FIG. 7, a flow diagram is provided to illustrate the general process by which the embodiment of the present invention is implemented. The process begins with block 270 "Adjust heat chamber temperature", at which stage the temperature of heat chamber 226, shown in FIG. 4 is brought to a temperature at which the solder bonding components 106 to circuit boards 104 can be made to reflow. The process follows path 272 to decision block 274 "Is reflow temperature reached?", at which stage the process checks to see whether reflow temperature has been reached. If it has not, then the process continues to return to block 270 over path 276 until the correct temperature is achieved.

When decision block 274 is answered in the affirmative, meaning that the reflow temperature has been reached in heat chamber 226, then the process advances through path 280 to block 282 "Reflow solder". At this point, the solder bonding components 106 to a given circuit board 104 is made to reflow by exposing circuit board 104 to IR panels 64, as shown in connection with the discussion of FIGS. 1, 3, 4, and 5. As this occurs, the physical bond affixing components 106 to circuit boards 104 melts and significantly weakens.

Referring back to FIG. 7, as the physical bond is softened and weakened, the process next advances along path 284 to block 286 "Dislodge components with tapper". At this stage of the process, a given circuit board 104 is exposed to the striking force of tapper 76, shown in FIGS. 1, 3, and 5. Tapper 76 will have a tendency to dislodge components 106 from circuit board 104 as a result of the impact from the blows, and the falling components are caught in bins 50, 52, 54.

Figure 8A:
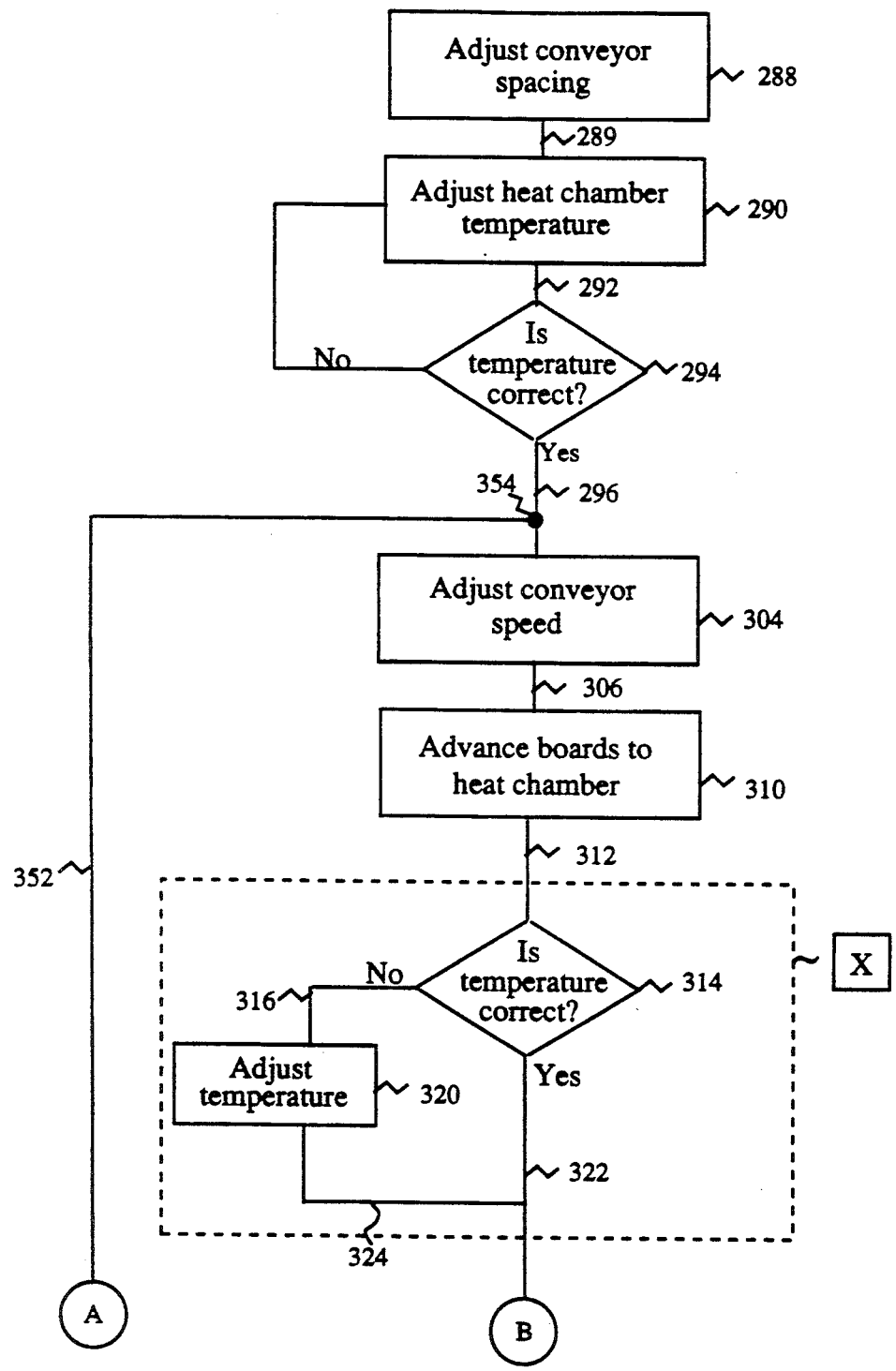
FIGS. 8A and 8B, when placed top to bottom, form a more detailed flow diagram depicting the method by which the embodiment of the invention shown in FIG. 1 is implemented.
Figure 8B:
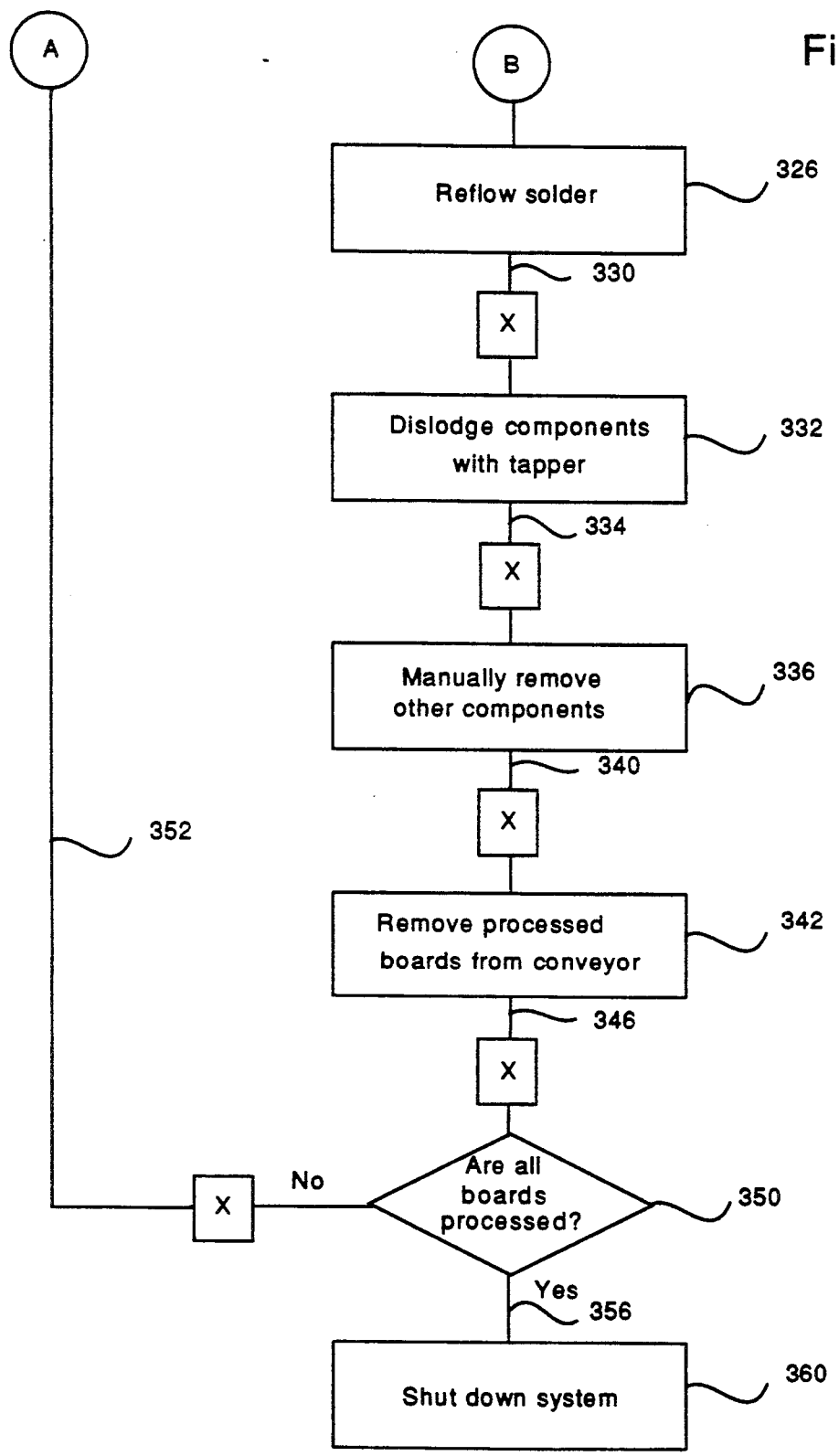

Although FIG. 7 provides an overview of a general process by which the embodiment of the present invention may be implemented, FIGS. 8A and 8B provide a flow diagram with a more detailed description of the embodiment of the present invention. FIGS. 8A and 8B are intended to be placed top to bottom to show a complete flow diagram, and will hereinafter be referred to as simply "FIG. 8". The discussion of FIG. 8 together with FIG. 9 will detail how the embodiment of the present invention is used to automate the removal of components from printed circuit boards, while achieving a high volume throughput.

Referring first to FIG. 8, the process begins with block 288 "Adjust conveyor spacing", at which stage adjustment wheel 190 is turned so that the spacing between support rail 44 and support rail 46 is correctly adjusted to accommodate the specific size circuit boards 104 that are to be processed.

The process continues along path 289 to block 290 "Adjust heat chamber temperature", during which stage the temperature of heat chamber 226, shown in FIG. 4 is brought to a temperature at which the solder bonding components 106 to circuit boards 104 can be made to reflow. The process follows path 292 to decision block 294 "Is reflow temperature reached?", through which the process checks to see whether reflow temperature has been reached. If it has not, then the process continues to return to block 290 until the correct temperature is achieved.

Although not shown in any of the drawings, the most convenient method for raising the temperature in heat chamber 226 has been to position a number of metal blanks in conveyor 40, much the same as if the conveyor was loaded with circuit boards 104. The blanks have the same general shape and dimensions as the boards that are processed by system 20. The blanks are advanced on conveyor 40 so that the entire length of conveyor 40 is full of the blanks, at which point conveyor is stopped. The blanks thereby substitute for circuit boards 104 in forming one side of heat chamber 226, as discussed above. Accordingly, the blanks assist in retaining the heat generated by IR panels 64 in heat chamber 226 until the desired temperature is achieved. After the desired temperature is achieved, conveyor 40 can be started and the blanks will each be advanced to the end of conveyor 40, at which stage they can be removed.

When decision block 294 is finally answered in the affirmative, meaning that the reflow temperature has been reached in heat chamber 226, then the process advances through path 296 to block 304 "Adjust conveyor speed" at which point the speed at which conveyor 40 will carry the circuit boards 104 past IR panels 64 is set. The actual speed setting balances the need to move the circuit boards 104 slow enough so that the solder bonding components 106 to circuit boards 104 will reflow, but fast enough so that volume throughput can be achieved.

Once the correct temperature is achieved, and the spacing and speed of conveyor 40 is set, the process continues on path 306 to block 310 "Advance boards to heat chamber". As described above in connection with the discussion of FIG. 3, at this stage circuit boards 104 are first set against supporting lips 100, 102 with their component sides down. They are then slid into moving conveyor 40 so that upper edge 110 and lower edge 112 are respectively grasped by inner fork rows 130, 134. Progressively more of circuit board 104 will be drawn into conveyor 40 until edges 110, 112 are completely held between forks 124. As the conveyor commences moving, the blank metal sheets that were used to preheat system 20 will be removed from the end of conveyor 40 which is opposite from supporting lips 100, 102.

Figure 9:
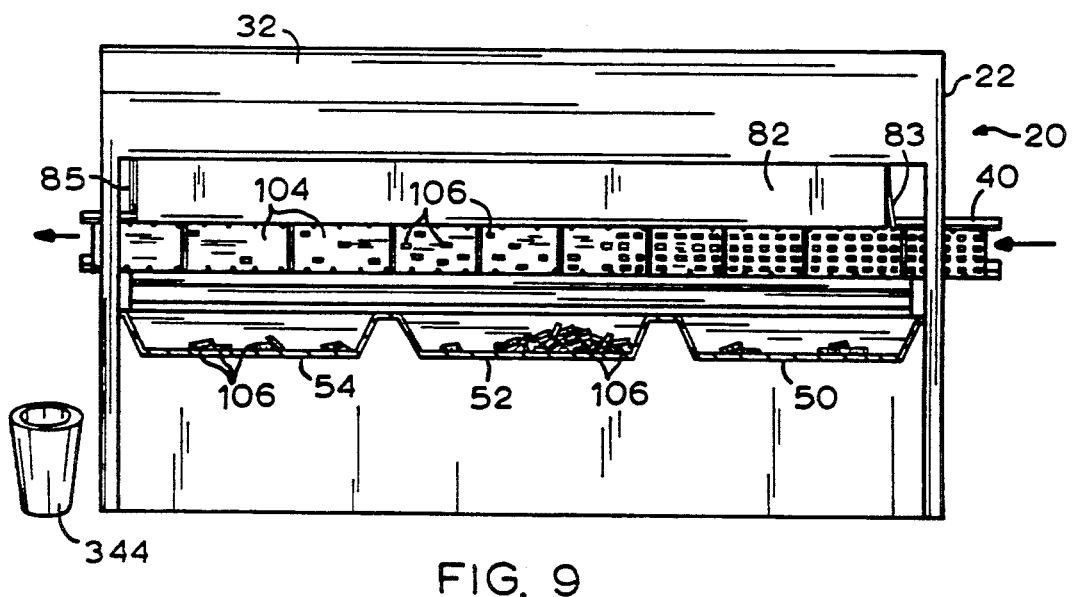
FIG. 9 is a front view of the embodiment of the invention showing a number of printed circuit boards moving along the conveyor system, and further showing that the boards have fewer and fewer components remaining on them as they progress through the system.

System 20 is configured such that as one circuit board 104 is advanced further into conveyor 40 another circuit board 104 is set against supporting lips 100, 102 and similarly fed into conveyor 40 so that a series of boards are positioned edge to edge beside each other, as shown on FIG. 9.

As circuit boards 104 are advanced to heat chamber 226 system 20 will continue to sense and test the temperature in heat chamber 226 to insure it is the optimal temperature for reflowing the solder on circuit boards 104. As discussed above in connection with FIGS. 1 and 6, system 20 includes control gauges 86 with thermocouple sensors in IR panels 64, which constantly turn IR panels 64 on and off in order to assure that correct temperature is maintained.

Referring again to FIG. 8, after block 310, the process advances along path 312 to decision block 314 "Is temperature correct?" indicating that control gauges 86 are testing the temperature. If the temperature is not correct, and decision block 314 is answered in the negative, the process proceeds along path 316 to block 320 "Adjust temperature". At this point control gauges 86 would respond to the temperature condition by turning IR panels 64 on or off depending upon whether the temperature needed to be raised or lowered. On the other hand, if the temperature is correct, and decision block 314 is answered in the affirmative, the process proceeds along path 322, and no adjustment needs to be performed by control gauges 86. Also, after the process exits from block 320 it proceeds along path 324 to join path 322.

In FIG. 8, a dashed line has been drawn around decision block 314 and block 320, and the dashed block has been labeled "X". To the extent that system 20 is constantly checking and adjusting the temperature in heat chamber 226 through control gauges 86, the checking and adjustment process will constantly be repeated during all other stages of the process. Therefore, for the convenience of repeating this stage of the process at other points of the flow diagram without having to repeat this entire portion of the drawing, the repetition of this stage will be represented by the simple block X. Moreover, the discussion of the later stages of the flow diagram will not repeat a description of what is occurring in block X, it being understood that system 20 is constantly checking and adjusting the temperature as described.

The process next advances along path 322 to block 326 "Reflow solder" at which point the solder bonding components 106 to a given circuit board 104 is made to reflow by exposing circuit board 104 to IR panels 64, as shown in FIGS. 1, 3, 4, and 5. As this occurs, the physical bond affixing components 106 to circuit boards 104 melts and weakens. As the physical bond is weakened, the process shown in FIG. 8 advances along path 330 to block 332 "Dislodge components with tapper", passing through block X indicating that the temperature is being monitored and possibly adjusted. At this stage of the process, a given circuit board 104, which is passing in front of tapper 76 on conveyor 40, is exposed to the striking force of tapper 76. That force will have a tendency to dislodge components 106 from circuit board 104.

It has been found that not all components 106 on circuit boards 104 will necessarily be dislodged by tapper 76. The success of dislodging a given component has largely been found to depend on whether the component is crimped to the board. In some component mounting techniques, one or more of the leads of the component may extend out of the back of the board so that they can be bent to insure that the component stays in place. Components with such crimped leads tend to stay on the boards even after reflow and tapping because the crimped lead keeps the component fixed to the board. On the other hand, components which are surface mounted, or through hole mounted without a crimped lead in the backside of the board, tend to be more readily removed through the reflow and tapping process.

Given that not all components will necessarily be removed through reflow and tapping, the process next proceeds along path 334, through block X, to block 336 "Manually remove other components". As described above in connection with FIG. 1, in the preferred embodiment of the present invention, system 20 includes two operator stations, which are defined by the placement of resting pads 60, 62. During the operation of system 20 an operator 36 could be seated in front of each one of resting pads 60, 62 for the purpose of manually removing any components 106 which have not been successfully dislodged by tapper 76. By the time circuit boards 104 have reached operators 36, if the components have not fallen off or been dislodged by tapper 76, it is unlikely they will drop off of circuit boards 104 without manual intervention. Accordingly, system 20 is configured so that operators 36 can comfortably work in front of shield 66 with their arms extending under shield 66 to pull the reclaimable components off of circuit board 104 and then drop the reclaimed components in bins 50, 52, 54, as shown and discussed in connection with FIG. 1.

Given that operator 36 may need manually remove some components from boards 104, it is desirable to angle conveyor 40 so that the passing boards are partially facing upward. On the other hand, given that it is desirable to have the force of gravity assist in the removal of the components after the bond between the component and board is weakened, it is desirable to angle conveyor 40 so that the passing boards are partially facing downward. Accordingly, the embodiment of the present invention accommodates these two objectives by angling conveyor 40 at 45 degrees relative to the horizontal plane.

After components 106 have been dislodged or manually removed, the process shown in FIG. 8 progresses along path 340 to block 342 "Remove processed boards from conveyor". At this stage of the process, all of the reclaimable components have been removed and circuit boards 104 are ready to be removed from system 20, given that no further processing is required. As seen by looking at FIG. 9, in the embodiment of the invention, circuit boards 104 are free to simply drop off of conveyor 40 into a collection canister 344. This approach may damage circuit boards 104 given that they will drop on top of each other, but such potential damage may not be a factor if circuit boards 104 will otherwise be scraped or melted. In another approach, circuit boards 104 may be manually removed by an operator 36 as they are advanced to the very end of conveyor 40.

After the processing of a given circuit board 104 is completed, the process advances over path 346 to decision block 350 "Are all boards processed?", at which point it is determined whether more circuit boards 104 are on conveyor 40 for like processing. If the answer is negative, meaning that more circuit boards 104 must be processed, then the process follows path 352 back to point 354 so that the same reclamation method can continue until all circuit boards 104 are treated.

When the last of the circuit boards to be processed, have been fed into conveyor 40, operator 36 will again mount the blank plates which were used for preheating. As discussed, they remaining boards and blanks will be mounted side by side. This insures that the temperature of heat chamber 226 will remain at the proper level as the final boards are processed in the reclamation system. After decision block 350 is answered in the affirmative, the process advances along path 356 to block 360 "Shut sown system", at which point system 20 is turned off.

Referring now to FIG. 9, an overview of the progression of the process described in connection with FIG. 8 is seen. Although system 20 is loaded completely with circuit boards 104 on conveyor 40, it can be imagined that as the boards were loaded and began moving on conveyor 40, they passed through side curtain 83. The arrows of FIG. 9 indicate the direction in which circuit boards 104 are being advanced.

As shown in FIG. 9, those boards that have just started on conveyor 40 have all of their components 106 still affixed to circuit board 104. As the boards are advanced by conveyor 40 and IR panels 64 (not shown in FIG. 9, but shown in FIGS. 1, 3, 4, and 5) weaken the solder bond, some of the components will fall off of circuit board 104 into bin 50 due to the 45 degree downward angling of circuit boards 104.

As conveyor 40 further advances circuit boards 104, they will then move in front of tapper 76 (not shown in FIG. 9, but shown in FIGS. 1, 3, 4, and 5), which will strike the backs of circuit boards 104 and dislodge components 106. Circuit boards 104 which are in the central portion of conveyor 40 are the circuit boards 104 that are being struck by tapper 76 with the falling components 106 accumulating in bin 52.

The circuit boards 104 which are nearing the end of the process have few components 106 on left on them, and those remaining components 106 could be removed by an operator 36 (not shown in FIG. 9, but shown in FIG. 1.) Finally, as the circuit boards 104 near the end of the process they will pass through side curtain 85 and fall off of conveyor 40 into collection canister 344.

While presently preferred embodiments of the invention have been given for the purpose of disclosure, numerous changes in the details of construction, arrangement of parts, and steps of the process will be readily apparent to those skilled in the art. Accordingly, the invention in its broader aspects is not limited to the specific details, representative apparatus, and illustrative examples shown and described herein. Thus, departures may be made from such details without departing from the spirit or scope of the invention.

What is claimed is:

1. An apparatus for removing a component from a circuit board, the component being affixed to the board by means of a heat softenable bond, said apparatus comprising:
   means for radiantly heating the heat softenable bond sufficiently to allow the removal of the component from the board; and
   means for impacting the board in order to remove the component from the board while the bond is softened.

2. The apparatus as in claim 1, wherein said impacting means comprises a tapper which strikes the board.

3. The apparatus as in claim 1, further comprising a holding means for holding the board at an angle that is oblique to a horizontal plane, as the board is exposed to said heating means and said impacting means.

4. The apparatus as in claim 3, wherein said holding means comprises a conveyor having a means for grasping the board for securely holding the board on said conveyor.

5. The apparatus as in claim 3, wherein said holding means holds the board at an angle that ranges between 20-60 degrees relative to the horizontal plane.

6. The apparatus as in claim 1, wherein said heating means comprises an infrared panel.

7. The apparatus as in claim 6, wherein said infrared panel produces a wavelength between 4.0-6.0 microns.

8. An apparatus for removing a component from a circuit board, the component being affixed to the board by means of a heat softenable bond, said apparatus comprising:
   means for radiantly heating the heat softenable bond sufficiently to allow for the removal of the component;
   means for impacting the board in order to remove the component from the board while the bond is softened; and
   means for holding the board at an angle that is oblique to a horizontal plane, as the board is exposed to said heating means and said impacting means, such that the side of the board on which the component is mounted is facing downwardly.

9. The apparatus as in claim 8, wherein said holding means comprises a conveyor for transporting the boards into proximity with said heating means and said impacting means.

10. The apparatus as in claim 9, wherein said conveyor holds the board at an angle that ranges between 20-60 degrees relative to a horizontal plane.

11. The apparatus as in claim 10, wherein said conveyor includes grasping means for securely holding the board so that the board is not displaced from said conveyor when it is exposed to said impacting means.

12. The apparatus as in claim 11, wherein said grasping means comprises a plurality of grasping forks.

13. The apparatus as in claim 8, wherein said impacting means comprises a tapper which strikes the board.

14. The apparatus as in claim 13, wherein said tapper comprises a cam actuated bar.

15. The apparatus as in claim 8, wherein said impacting means comprises a piston.

16. The apparatus as in claim 8, wherein said heating means comprises an infrared panel.

17. The apparatus as in claim 16, wherein said infrared panel produces a wavelength between 4.0-6.0 microns.

18. An apparatus for removing a component from a circuit board, the component being affixed to the board by means of a heat softenable bond, said apparatus comprising:
   an infrared panel for heating the board so that the bond between the board and the component is softened sufficiently to allow for the removal of the component;
   a tapper for impacting the board in order to remove the component from the board while the bond is softened; and
   a conveyor for transporting the board into proximity with said infrared panel and said tapper and for holding the board at an angle that is oblique to a horizontal plane, such that the side of the board on which the component is mounted is facing downwardly and the side of the board which is exposed to said infrared panel and said tapper is facing upwardly.

19. The apparatus as in claim 18, wherein said conveyor holds the board at an angle between 20-60 degrees relative to a horizontal plane.

20. The apparatus as in claim 19, wherein said conveyor includes a plurality of grasping forks for securely holding the board by its edges such that the board is not displaced from said conveyor when it is exposed to said tapper.

21. The apparatus as in claim 20, wherein said tapper comprises a cam actuated bar having a striking end, said striking end being positioned relative to the board held by said grasping forks such that as the board is transported by the conveyor said striking end strikes the board between its edges.

22. The apparatus as in claim 18, wherein said infrared panel produces a wavelength between 4.0-6.0 microns.

23. A method of removing a component from a circuit board, the component being affixed to the board by means of a heat softenable bond, said method comprising the steps of:
   exposing the board to a radiant heating means for softening the bond between the board and the component; and
   impacting the board while the bond is in a softened state to remove the component from the board.

24. The method as in claim 23, further comprising the step of:
   transporting the board into proximity with the heating means and the impacting means with a board holding means, such that the heating means is able to soften the bond and the impacting means is able to impact the board.

25. The method as in claim 23, further comprising the step of:
   holding the board at an angle that is oblique to a horizontal plane such that the side of the board on which the component is positioned is facing downwardly.

26. A method of removing a component from a circuit board, the component being affixed to the board by means of a heat softenable bond, said method comprising the steps of:
   holding the board at an angle that is oblique to the horizontal plane such that the component side of the board is facing downwardly;
   exposing the board to a radiant heating means for softening the bond between the board and the component; and
   impacting the board while the bond is in a softened state to remove the component from the board.

27. The method as in claim 26, further comprising the step of:
   transporting the board into proximity with the heating means and the impacting means using a board holding means.

28. The method as in claim 26, further comprising the step of:
   testing the heating means to determine whether the heating means is providing sufficient heat to soften the bond between the component and the board.

29. A method of removing a component from a circuit board, the component being affixed to the board by means of a heat softenable bond, said method comprising the steps of:
   mounting the board on a conveyor which holds the board at an angle that is oblique to the horizontal plane such that the component side of the board is facing downwardly;
   moving the board by means of the conveyor into proximity with a radiant heating means for softening the bond between the board and the components;

exposing the bond to the heating means long enough so that the bond is sufficiently softened so that the component can be removed from the board; and impacting the board while the bond is in a softened state to remove the component from the board.

30. The method as in claim 29, wherein said heating means comprises an infrared panel.

31. The method as in claim 30, wherein said infrared panel produces a wavelength between 4.0–6.0 microns.

32. The method as in claim 31, further comprising the step of:

continuously measuring the heat generated by the infrared panel to determine if the heat is sufficient to soften the bond.

33. The method as in claim 32, further comprising the step of:

adjusting the heat generated by the infrared panel in response to said testing step, in order to insure that the heat produced by the infrared panel is sufficient to soften the bond.

* * * * *